(12) United States Patent
Raaijmakers et al.

(10) Patent No.: US 7,276,774 B2
(45) Date of Patent: Oct. 2, 2007

(54) TRENCH ISOLATION STRUCTURES FOR INTEGRATED CIRCUITS

(75) Inventors: Ivo Raaijmakers, Bilthoven (NL); Pekka T. Soininen, Helsinki (FI); Ernst H. A. Granneman, Hilversum (NL)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 10/867,826

(22) Filed: Jun. 14, 2004

(65) Prior Publication Data

US 2004/0222490 A1 Nov. 11, 2004

Related U.S. Application Data

(62) Division of application No. 09/887,199, filed on Jun. 21, 2001, now Pat. No. 6,861,334.

(51) Int. Cl.
*H01L 21/762* (2006.01)
(52) U.S. Cl. ............... 257/506; 257/510; 257/E21.546
(58) Field of Classification Search ............... 257/506, 257/510, E21.546
See application file for complete search history.

(56) References Cited

U.S. PATENT DOCUMENTS

| | | | | |
|---|---|---|---|---|
| 3,826,813 | A | * | 7/1974 | Gardner et al. ........... 423/327.1 |
| 4,058,430 | A | | 11/1977 | Suntola et al. ............... 156/611 |
| 4,544,576 | A | * | 10/1985 | Chu et al. .................... 438/438 |
| 4,646,123 | A | * | 2/1987 | Lynch et al. ................. 257/374 |
| 4,826,790 | A | * | 5/1989 | Jones et al. .................... 501/90 |
| 4,847,214 | A | * | 7/1989 | Robb et al. .................. 438/430 |
| 5,229,317 | A | * | 7/1993 | Nishio ......................... 438/426 |
| 5,541,440 | A | * | 7/1996 | Kozai et al. ................. 257/513 |
| 5,561,073 | A | * | 10/1996 | Jerome et al. ............... 438/404 |
| 5,911,109 | A | * | 6/1999 | Razouk et al. .............. 438/424 |
| 6,203,613 | B1 | | 3/2001 | Gates et al. |
| 6,399,449 | B1 | * | 6/2002 | Matsumoto ................. 438/296 |

(Continued)

FOREIGN PATENT DOCUMENTS

WO WO96/17107 6/1996

OTHER PUBLICATIONS

IBM Technical Disclosure Bulletin, Lead Silicate Glasss Isolation Technology, Dec. 1983, vol. 26, Issue #7A, pp. 3194-3197.*

(Continued)

*Primary Examiner*—Anh Duy Mai
(74) *Attorney, Agent, or Firm*—Knobbe Martens Olson & Bear LLP

(57) ABSTRACT

A dielectric film is formed by atomic layer deposition to conformally fill a narrow, deep trench for device isolation. The method of the illustrated embodiments includes alternately pulsing vapor-phase reactants in a string of cycles, where each cycle deposits no more than about a monolayer of material, capable of completely filling high aspect ratio trenches. Additionally, the trench-fill material composition can be tailored by processes described herein, particularly to match the coefficient of thermal expansion (CTE) to that of the surrounding substrate within which the trench is formed. Mixed phases of mullite and silica have been found to meet the goals of device isolation and matched CTE. The described process includes mixing atomic layer deposition cycles of aluminum oxide and silicon oxide in ratios selected to achieve the desired composition of the isolation material, namely on the order of 30% alumina and 70% silicon oxide by weight.

14 Claims, 12 Drawing Sheets

U.S. PATENT DOCUMENTS

| | | | |
|---|---|---|---|
| 6,534,395 B2* | 3/2003 | Werkhoven et al. | 438/627 |
| 6,703,708 B2* | 3/2004 | Werkhoven et al. | 257/751 |
| 6,750,066 B1* | 6/2004 | Cheung et al. | 438/3 |
| 2001/0006839 A1 | 7/2001 | Yeo | |
| 2002/0031618 A1 | 3/2002 | Sherman | |
| 2005/0054213 A1* | 3/2005 | Derderian et al. | 438/778 |

OTHER PUBLICATIONS

R. Sadanaga et al. The Structure of Mullite, 2Al2O3.SiO2, and Relationship with the Structures of Silimanite and Andalusite, Acta Cryst. 1962, pp. 65-68.*

"SOI Technology: IBM's Next Advance in Chip Design," World wide web address: chips.ibm.com/bluelogic/showcase/soi/soipaper.pdf pp. SOI 1-SOI 10.

Dücsö, C. et al., *Research Institute for materials Science—ATKI, H-1525 Budapest, Hungary,* Utrianen, M. et al., *Laboratory of Inorganic and Analytical Chemistry, Helsinki University of Technology, FIN-02150 Espoo, Finland,* "Deposition of Tin Oxide into Porous Silicon by Atomic Layer Epitaxy," *J. Electrochemical Society,* vol. 143, No. 2, pp. 683-687 (1996).

Hergenrother et al., "50 nm Vertical Replacement-Gate (VGR) nMosfets with ALD HfO@ and Ai2O3 Gate Dielectrics" IEDM 2001, pp. 51-54.

Horike, Y. et al., "Filling of Si oxide into a deep trench using digital CVD method," *Applied Surface Science,* vol. 46, pp. 168-174 (1990).

Kaizuke, T. et al., "Conformal Chemical Vapor Deposition TiN(111) Film Formation as an Underlayer of Al for Highly Reliable Interconnects," *Jpn. J. Appl. Phys.,* vol. 33, Part 1, No. 1B, pp. 470-474 (1994).

Kukli, K. et al., Atomic Layer Epitaxy Growth of Tantalum Oxide Thin Films from Ta(OC$_2$H$_5$)$_5$ and H$_2$O, *J. Electrochem. Soc.,* vol. 142, No. 5, pp. 1670-1674 (1995).

Lee, William E. D Phil. et al., Department of Engineering Materials and Sorby Centre for Electron Microscopy, Shelfield University, Shelfield, UK., *Ceramic Microstructures. Property control by processing,* Chapman & Hall publishers, p. 297 (1994).

Min, Jae-Sik et al., "Atomic Layer Deoposition of TiN Thin Films by Sequential Introduction of Ti Precursor and NH$_3$," *Mat. Res. Soc. Symp. Proc.,* vol. 514, pp. 337-342 (1998).

Min, Jae-Sik et al., "Atomic Layer Deposition of TiN Films by Alternate Supply of Tetrakis (ethylmethylamino)-Titanium and Ammonia," *Jpn. J. Appl. Phys.,* vol. 37, Pt. 1, No. 9A, pp. 4999-5004 (1998).

Niinistö, L. et al., "synthesis of oxide thin films and overlayers by atomic layer epitaxy for advanced applications," *Materials Science and Engineering,* vol. B41, pp. 23-29 (1996).

Ott, A.W. et al., "Modification of Porous Alumina Membranes Using Al2O3 Atomic Layer Controlled Deposition," *Chem. Mater.,* vol. 9, No. 3, pp. 707-714 (1997).

Ritala, M. et al., "Couumincations. Perfectly Conformal TiN and Al2O3 Films Deposited by Atomic Layer Deposition," *Chemical Vapor Deposition,* vol. 5, No. 1, pp. 7-9 (1999).

Sakaue, H. et al., "Digital Chemical Vapor Deposition of SiO2 Using a Repetitive Reaction of Triethylsilane/Hydrogen and Oxidation," *Japanese Journal of Applied Physics,* vol. 30, No. 1B, pp. L 124-L 127 (1990).

Sneh, O. et al., "Atomic layer growth of SiO2 on Si(100) using SiCl4 and H2O in a binary reaction sequence," *Surface Science,* vol. 334, pp. 135-152 (1995).

Suntola, T., "Atomic Layer Epitaxy," *Handbook of Crystal Growth 3. Thin Films and Epitaxy. Part B: Growth Mechanisms and Dynamics,* D.T.J. Hurle editor, Chapter 14, pp. 602-663 (1994).

Titala, M. et al., "Atomic Layer Epitaxy Growth of TiN Thin Films from TiI$_4$ and NH$_3$," *J. Electrochem. Soc.,* vol. 145, No. 8, pp. 2914-2920 (1998).

Wise, M.L. et al., "Diethyldiethoxysilane as a New Precursor for SiO$_2$ Growth on Silicon," *Mat. Res. Soc. Symp. Proc.,* vol. 334, pp. 37-43 (1994).

* cited by examiner

TRENCH ISOLATION STRUCTURES FOR INTEGRATED CIRCUITS

REFERENCE TO RELATED APPLICATION

This application is a divisional of application Ser. No. 09/887,199, filed Jun. 21, 2001, now U.S. Pat. No. 6,861,334.

BACKGROUND OF THE INVENTION

In silicon integrated circuit technology, a large number of isolated devices are fabricated on the same semiconductor substrate. Subsequently these devices are interconnected along specific paths to create the desired circuit configuration. In the continuing trend toward higher densities, devices are placed closer together with smaller spaces between them. Device isolation, which is critical to proper circuit operation, has become progressively more challenging.

Over the last few decades a variety of isolation technologies have been developed to address the requirements of various integrated circuit types. In general, the various isolation technologies are different with respect to characteristics such as minimum isolation spacing, surface planarity, process complexity and defect density generated during isolation processing. Moreover, it is common to make trade-offs among these characteristics when developing an isolation process for a particular integrated circuit application.

In MOS (metal-oxide-semiconductor) technology, LOCOS isolation (LOCal Oxidation of Silicon) has been the most widely used isolation technology. LOCOS isolation involves thermal oxidation of a silicon substrate through a mask. The resultant field oxide is generally grown thick enough to avoid cross-talk between adjacent devices, but not so thick as to cause step coverage problems. The great popularity of LOCOS isolation technology can be attributed also to its inherent simplicity in MOS process integration, its cost effectiveness and its adaptability.

In spite of its success, several limitations of LOCOS technology have driven the development of alternative isolation structures. A well-known limitation in LOCOS isolation is oxide undergrowth at the edge of the hard mask (typically made of silicon nitride) that protects the active regions of the substrate during oxidation. This so-called "bird's beak" poses a limitation to device density since it widens the isolation region, thereby reducing resolution, while causing stress within the substrate. Another problem associated with the LOCOS process is its non-planarity. For submicron devices, non-planarity becomes an important issue, often posing problems for photolithography and subsequent layer conformality.

Trench isolation technology has been developed, in part, to overcome the aforementioned limitations of LOCOS isolation for submicron devices. Refilled trench structures comprise a recess formed in the silicon substrate, which is filled with a dielectric material. Such structures are fabricated by first forming submicron-sized trenches in the silicon substrate, usually by a dry anisotropic etching process through openings in a photoresist overlayer. Typically the resulting trenches display a steep sidewall profile. The trenches are refilled with a dielectric material, such as silicon dioxide ($SiO_2$), usually deposited by a chemical vapor deposition (CVD) or spin-on glass (SOG) process. Then the surface is smoothed by an etchback or polishing process so that the trench is completely filled with the dielectric material, and its top surface is level with the silicon substrate. After a successful etchback, the top surface has good planarity and is at the same level as the surrounding substrate. The resulting structure serves to electrically isolate adjacent devices.

Refilled trench isolation can take a variety of forms depending upon the specific application. It is generally categorized in terms of the trench dimensions: shallow trenches (<1 μm deep), moderate depth trenches (1-3 μm deep), and deep, narrow trenches (>3 μm deep, <2 μm wide). Shallow Trench Isolation (STI), for example, is used primarily for isolating devices of the same type and is often considered an alternative to LOCOS isolation. Furthermore, shallow trench isolation has the advantages of eliminating the bird's beak of LOCOS and providing a high degree of surface planarity.

The basic trench isolation process is, however, subject to drawbacks, including void formation in the trench during dielectric refill. Voids result when the refilling dielectric material forms a constriction near the top of the trench before it is completely filled, as shown in FIG. 1A. Such voids compromise device isolation as well as the overall structural integrity of the integrated circuit. Unfortunately, preventing void formation during trench refill often places minimum size constraints on the trenches themselves, which can limit device packing density or the effectiveness of the device isolation. A key parameter in measuring the effectiveness of device isolation is the field threshold voltage, that is, the voltage necessary to create a parasitic current linking adjacent isolated devices. The field threshold voltage is influenced by a number of physical and material properties, such as trench width, dielectric constant of the trench filling material, substrate doping, field implant dose and substrate bias.

Generally, void formation has been mitigated by decreasing trench depth and/or tapering trench sidewalls so that the openings are wider at the top than at the bottom, as shown in FIG. 1B. A principal trade off in decreasing the trench depth is reducing the effectiveness of the device isolation, while the larger top openings of trenches with tapering sidewalls use up additional and valuable integrated circuit real estate.

Accordingly, it is desirable to develop a trench isolation process that overcomes the problem of void formation while providing effective device isolation.

1. Field of the Invention

The invention relates generally to integrated circuit design and process technology. In particular, the invention pertains to a trench isolation structure and a method for filling isolation trenches.

2. Description of the Related Art

\*

SUMMARY OF THE INVENTION

In accordance with one aspect of the present invention, a method of fabricating trench isolation structures between integrated electrical devices in a semiconductor substrate is provided. The method includes filling the trenches with insulating material by atomic layer deposition, comprising a plurality of primary cycles. Each primary cycle comprises, in sequence, introducing a first vapor-phase reactant to the substrate, thereby forming no more than about one monolayer of a first reactant species, conforming at least to surfaces of the trenches, removing excess first vapor-phase reactant and byproduct from the reaction chamber, introducing a second vapor-phase reactant to the substrate, thereby reacting with the first reactant species conforming at least to the surfaces of the trenches, and removing excess second vapor-phase reactant and byproduct from the reaction chamber.

In accordance with another aspect of the invention, a method is provided for forming a trench isolation structure in an integrated circuit. The method includes forming a trench in a semiconductor substrate and filling the trench with an insulating material comprising a mixture of silicon oxide and aluminum oxide.

In accordance with another aspect of the invention, a method is provided for fabricating a trench-fill structure in an integrated circuit. The method includes forming a trench within a structural material in a partially fabricated integrated circuit. A first filler material is deposited by a plurality of primary atomic layer deposition cycles, each of which deposits no more than about one monolayer of the first filler material. A second filler material is deposited by a plurality of secondary atomic layer deposition cycles, each of which deposits no more than about one monolayer of the second filler material. The primary and secondary cycles are performed a number of times to fill the trench. The ratio of primary cycles to secondary cycles is selected to form a composite filler material with a coefficient of thermal expansion (CTE) within about 20% of the structural material's CTE.

In accordance with another aspect of the present invention, an integrated circuit is described that comprises a semiconductor substrate with a plurality of neighboring active device regions, openings embedded within the semiconductor substrate between the neighboring active device regions and an insulating material that fills the openings conformally, the insulating material comprising a mixture of silica and mullite. In the illustrated embodiment, the ratio of mullite to silica in the insulating material is preferably between about 25 wt % mullite/75 wt % silica to about 50 wt % mullite/50 wt % silica, resulting in a coefficient of thermal expansion between about $2.0 \times 10^{-6}$/K and $3.0 \times 10^{-6}$/K.

In accordance with another aspect of the invention, a trench isolation structure in an integrated circuit is described that comprises an opening embedded within a semiconductor substrate between neighboring devices and an insulating material that fills the opening conformally and that has a linear coefficient of thermal expansion within about 20% of the linear coefficient of thermal expansion of the semiconductor substrate.

BRIEF DESCRIPTION OF THE DRAWINGS

These and further aspects of the invention will be readily apparent to those skilled in the art from the following description and the attached drawings, wherein.

DETAILED DESCRIPTION OF THE PREFERRED EMBODIMENT

Although described in the context of trench isolation structures in integrated circuits, the skilled artisan will readily find application for the principles disclosed herein in a number of other contexts. The processes and structures of the preferred embodiments have particular utility where extremely thin layers are desired, particularly within openings that are narrow and deep.

Figure 1A:
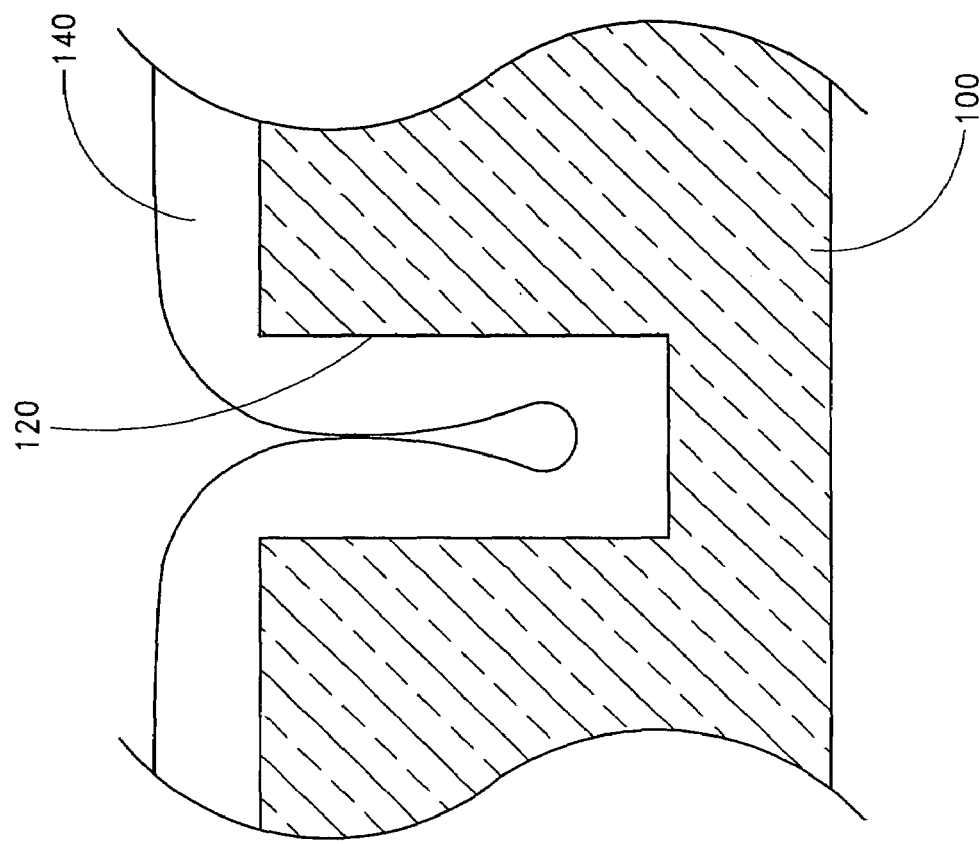
FIG. 1A is a schematic cross-section of a partially fabricated integrated circuit, illustrating a filled trench with a void embedded within a semiconductor substrate.

As noted in the Background section above, the trend in integrated circuit technology is toward increased miniaturization of devices. As devices are made smaller, other integrated circuit structures, such as isolation trenches, also become smaller and are therefore more and more difficult to fill by conventional means. For example, FIG. 1A illustrates schematically a trench isolation structure comprising a narrow trench 120 in a semiconductor substrate 100 that has been filled with a dielectric filler layer 140 by conventional chemical vapor deposition (CVD). As shown, the deposited filler layer 140 pinches off at the opening of the trench 120 before the trench is filled completely. The premature pinching off of the deposited layer 140 results in a void within the trench. Such voids are unacceptable for device isolation within the substrate.

Figure 1B:
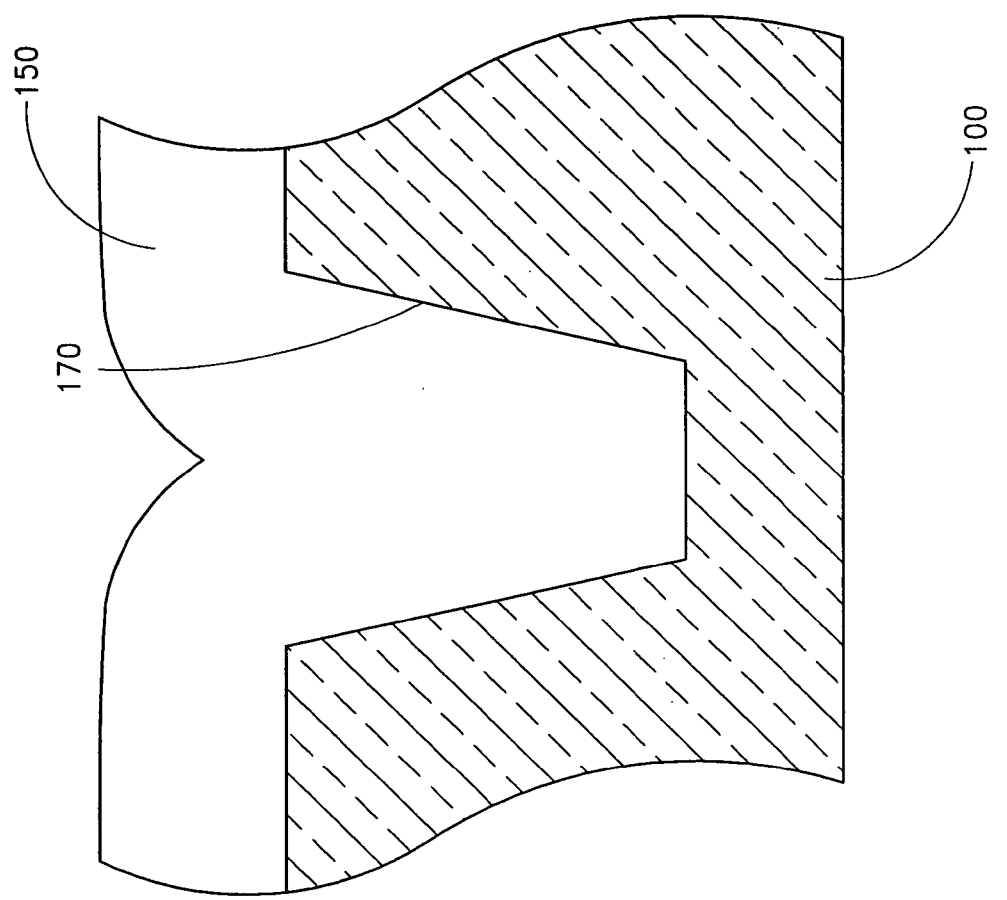
FIG. 1B is a schematic cross-section of a partially fabricated integrated circuit, illustrating a filled trench with tapered sidewalls.

A common solution to the problem of premature pinching off is to taper the trench sidewalls. FIG. 1B is a schematic illustration of an exemplary approach to prevent pinching off during conventional chemical vapor deposition (CVD). The sidewalls of the trench are tapered so that the deposited film 150 adequately fills the bottom of the trench 170 before the top is sealed. One disadvantage of the tapered trench, however, is that the trench 170 takes up extra space at the surface of the substrate 100 because of the wide opening, which ultimately limits circuit density.

Accordingly, prevailing development trends in integrated circuit technology have placed ever increasing demands on thin film deposition techniques. The continuous decrease in the size of devices and increase in design complexity require nearly perfect conformality and accurate film thickness control. It is an aspect of the present invention to provide a technique that addresses these requirements.

A thin film deposition technique that may meet these requirements is atomic layer deposition (ALD), known also as atomic layer epitaxy (ALE). ALD is a chemical vapor phase, thin film deposition technique wherein film growth proceeds by exposing the wafer surface to pulses of precursor gases. Individual precursors are pulsed onto the surface of the wafer alternately and sequentially and removed between the pulses, such as by evacuation or by purging with an inert gas. In one pulse, no more than about one monolayer of the precursor is absorbed onto the surface through chemisorption in a self-limiting reaction that stops when the surface is saturated. The gas in the next pulse either reacts directly with the monolayer or at least removes the self-limiting surface termination, thus allowing further reaction with a subsequent pulse. Films are built up by growing no more than about one monolayer at a time in a cycle of short bursts of gases, and thickness is controlled by the number of reaction cycles.

The principles of ALD are described by T. Suntola, for example, in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994 and in U.S. Pat. No. 4,058,430, the disclosures of both of which are incorporated by reference herein in their entirety. Theoretically, ALD films can have perfect uniformity and conformality over a large area, regardless of non-uniformities in reactant concentrations and temperatures across the area. Accordingly, a layer can be deposited to conform to and fill very narrow and deep trenches, even with large substrates, such as 300-mm silicon wafers.

Moreover, the inventors have realized that ALD also affords greater compositional flexibility. This realization has been applied to another source of stress and/or voids in semiconductor processing. In the course of fabricating an integrated circuit, the substrate is subjected to multiple thermal cycles, in which various materials undergo different thermal expansions. Disparate materials can thereby withdraw from one another (causing voids) or compress one another (causing stress). This is particularly true of trenches formed in a structural layer and filled with a different filler material. For example, in a conventional shallow trench isolation context, silicon oxide has a different coefficient of thermal expansion (CTE) than the silicon substrate that surrounds it. In part because of the excellent control enabled by ALD, materials can be selected to minimize differential thermal expansion while achieving the traditional goals of device isolation.

Figure 2:
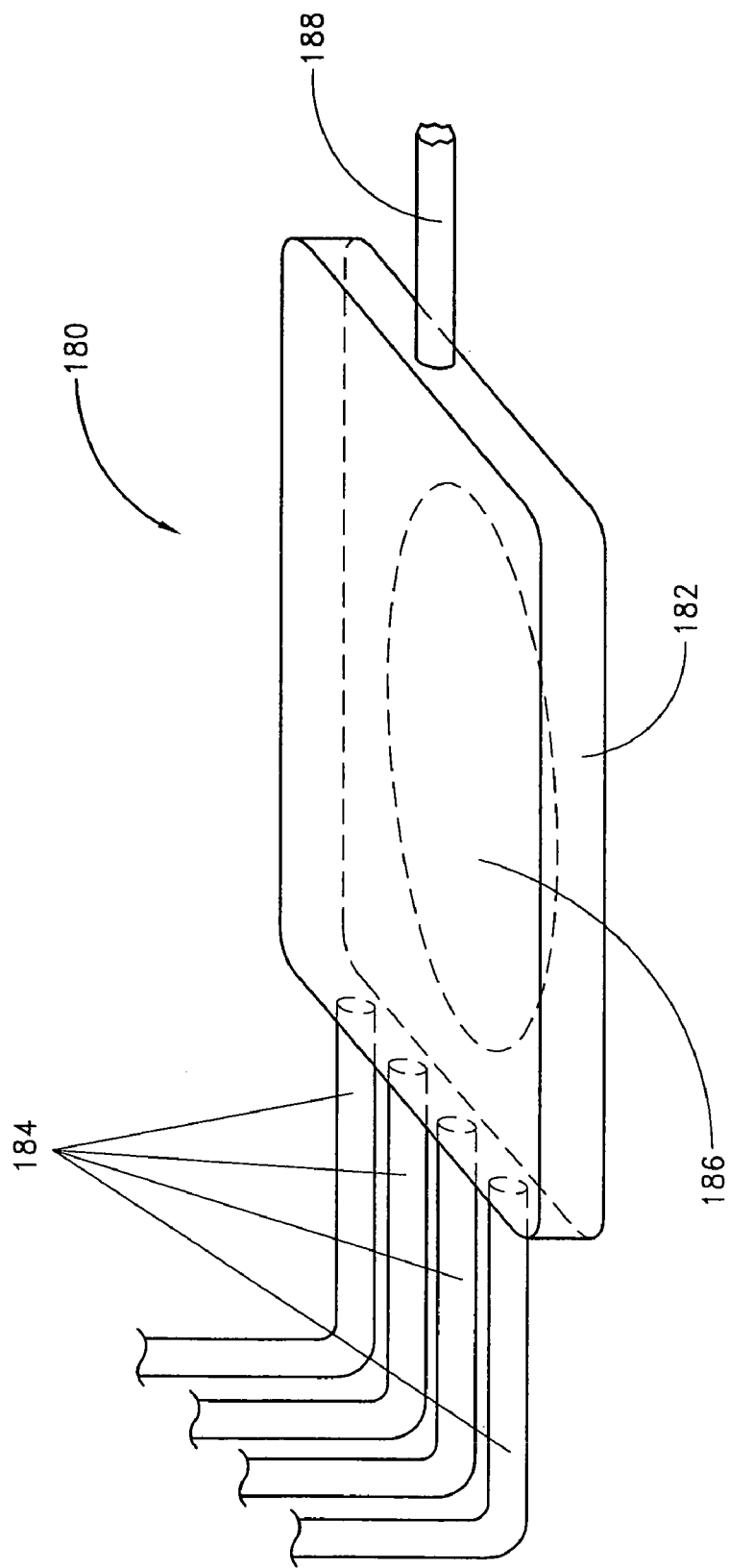
FIG. 2 is a schematic, perspective view of a single-substrate reaction chamber configured for atomic layer deposition.

FIG. 2 is a schematic representation of an ALD reactor 180 including a reaction chamber 182 configured to optimize deposition by ALD. This figure is a general illustration of a reaction chamber. It is not meant to be represent any specific reaction chamber, nor is it meant to include all necessary components of a reaction chamber. The process recipes provided herewith can be usefully employed in a Pulsar™ 2000 ALCVD™ reactor, commercially available from ASM Microchemistry Oy of Espoo, Finland. The skilled artisan can readily adjust process parameters for other reactors in view of the disclosure herein.

Gases flow into the reaction chamber 182 through a plurality of gas inlets 184. Vapor-phase reactants, such as precursor gases and oxidizing gases, and carrier gases communicate with the inlets 184. Advantageously, the inlets 184 are arranged to keep reactant gases separate until opening into the chamber 182, thereby avoiding undesirable CVD-type reactions and consequent particulate formation. Note that the terms "vapor-phase reactants" and "reactant gases" are meant to encompass even reactants that are considered to be in a liquid or solid phase at the reaction conditions, as long as they have a vapor pressure high enough to saturate the substrate surface in a reasonably short cycle.

Carrier gas can be any inactive gas suitable for conveying vapor-phase reactant gases through the chamber 182 and also can also be employed to purge the chamber between reactant gas pulses. The reactant gases pass over the substrate 186 where atomic layer deposition and oxidation can occur. Generally, though not necessarily, heaters (not shown) are also provided to heat the substrate to within an ALD temperature window, which depends upon the particular process used. Unused precursor gases, oxidizing gases, reaction products and carrier gases leave the chamber 182 through the gas outlet 188.

Preferred ALD Film Deposition Processes

It is difficult to deposit conformal layers to fill very narrow openings, for example narrower than 100 nm, with conventional fabrication methods, particularly where the opening has an aspect ratio greater than about 3:1 (depth: width). The preferred embodiments, however, employ atomic layer deposition (ALD), which forms thin films monolayer by monolayer. Advantageously, these atomically thin monolayers result in conformal deposition of filler material within very narrow openings or trenches.

In general, a structural material includes a trench to be filled with a different material. In the illustrated embodiment, the structural material comprises a semiconductor substrate, particularly a silicon wafer, having a trench defined therein to be filled with an insulating material. The substrate surface may be the top portion of an intrinsically doped silicon wafer or an epitaxial silicon layer. In other arrangements, the substrate can comprise alternative materials, such as III-V or other semiconductors. Trench-fill isolation can also be employed for silicon-on-insulator (SOI) technology. In still other arrangements, the structural material can comprise a thick, planarized insulating layer in which trenches or contact vias are formed, to be filled with a conductive material.

Surfaces of the trench within the structural material (substrate) are prepared to leave a surface termination that readily reacts with the first reactant in the ALD process. In the illustrated embodiment, wherein a dielectric layer is to be formed over a single-crystal silicon wafer, the bare silicon surface is preferably terminated with hydroxy (OH) tails. As will be appreciated by the skilled artisan, such a surface termination can be readily obtained by an ex situ HF dip, followed by exposure to the clean room atmosphere. In other arrangements, the substrate can be prepared by an in situ $H_2O$ vapor or alcohol/carboxylic acid vapor treatment. Exemplary alcohols include methanol, ethanol and propanol. An exemplary carboxylic acid is acetic acid.

In accordance with the preferred embodiment, a substrate with trenches is surface-treated for atomic layer deposition, either before or after being loaded into the reactor chamber. After the substrate is loaded, an inactive carrier gas flow purges the chamber to remove any atmospheric contaminants. Preferably, the carrier gas is nitrogen, helium or argon and flows from the inlet to the outlet. In the illustrated embodiment, the carrier gas is nitrogen. An exemplary gas flow rate is about 0.5-1.0 slm (standard liters per minute).

Temperature and pressure process parameters can be modified for individual film materials and for desired film characteristics. For an ALD silicon oxide process using 3-aminopropyltrimethoxysilane as a silicon precursor, for example, it is preferable to ramp the process temperature to a range of from about 150° C. to 400° C., and more preferably, from about 200° C. to 300° C. The pressure range is preferably from about 3 Torr to 50 Torr, and, more preferably, from about 5 Torr to 20 Torr.

In an alternative embodiment of the present invention, ALD of silicon oxide can take place at even lower temperatures. Using remote-plasma excited oxygen and/or nitrogen sources, even room temperature processing is possible. As will be appreciated by the skilled artisan, plasma processes generally employ lower pressures, such as in the millitorr (mTorr) range. Accordingly, any combination of precursor gases and carrier gas may be directed separately to the plasma generator which couples microwave energy from a magnetron to the flowing gases, thus generating excited species for an alternative process.

After the substrate reaches the desired reaction temperature and the chamber is set to the desired pressure level, precursor gases are released into the continuous carrier gas flow according to directions programmed into a central controller. The precursor gases are injected as pulses into the carrier gas flow and are thus distributed into the process chamber. These precursor gases flow through the process chamber, react with the substrate, and are drawn toward the outlet or exhaust port. Unreacted precursor gases and any gaseous reaction byproducts are purged from the chamber after the reaction through the outlet port by the continuously-flowing carrier gas.

A first precursor gas or vapor-phase reactant is pulsed into the chamber by injection into a carrier gas flow. A first chemical species from the precursor gas is adsorbed onto the prepared substrate. In the illustrated embodiments, wherein the desired films include silicon oxide, the first species comprises silicon and at least one other ligand. The result is a self-terminating monolayer of the silicon species. Preferably, the silicon source gas comprises a gas conducive to self-limiting chemisorption, such as silicon halides, halosilanes and organic silicon compounds. Examples include silicon tetrachloride ($SiCl_4$), dichlorosilane (DCS or $SiH_2Cl_2$), trichlorosilane (TCS or $SiHCl_3$), species of 3-aminoalkyltrialkoxysilane, such as 3-aminopropyltriethoxysilane ($NH_2CH_2CH_2CH_2$—$Si(O$—$CH_2CH_3)_3$ or AMTES) or 3-aminopropyltrimethoxysilane ($NH_2CH_2CH_2CH_2$—$Si(O$—$CH_3)_3$ or AMTMS), or other halosilane silicon sources. When the precursor is a liquid, such as TCS, the delivery system can include a bubbler and a gas line for bubbling $N_2$ through the liquid to transport silicon-containing gas molecules more effectively to the reaction chamber in gaseous form.

In an exemplary embodiment, the substrate comprises a silicon wafer having isolation trenches formed therein, and the substrate is maintained at a temperature between about 150° C. and 400° C., more preferably between about 200° C. and 300° C., while reactor pressure is maintained between about 5 Torr and 20 Torr. The skilled artisan will readily appreciate that reaction conditions can be varied for different reactors and different chemistries.

The silicon source gas comprises 3-aminopropyltriethoxysilane and is maintained for between about 0.5 seconds and 3.0 seconds under the preferred temperature and pressure conditions, and more preferably for between about 1.0 seconds and 2.0 seconds. No more than about monolayer of silicon chemisorbs onto the silicon substrate surface and terminates with organic or halide ligands. The surface termination of the monolayer inhibits further reaction with the silicon source gas.

After the silicon source pulse is turned off, carrier gas is allowed to flow for between about 0.5 seconds and 4.0 seconds, more preferably between about 1.0 seconds and 2.0 seconds, to purge excess source gas and reaction byproducts from the chamber prior to the next reactant pulse. In other arrangements, it will be understood that the chamber can be evacuated to remove the reactant species and byproducts.

Next, a second vapor-phase reactant is provided to the substrate by injection into the carrier gas flow. In the illustrated embodiment, the second reactant comprises an oxygen or oxidant source that reacts with the ligand termination, either organic or halide, of the adsorbed silicon monolayer, leaving oxygen atoms in place of the ligands.

Oxidizing gases such as ozone are preferred for silicon layers that terminate in organic ligands. The ozone is preferably injected into the carrier gas flow at a concentration of about 1-30 volume percent, more preferably about 2-25 volume percent. Under the preferred temperature and pressure conditions, the ozone pulse is maintained for between about 0.5 seconds and 5.0 seconds, more preferably between about 2.0 seconds and 4.0 seconds.

Oxidizing gases such as water vapor are preferred for silicon layers that terminate in halide ligands. The water vapor is preferably injected into the carrier gas flow. Under the preferred temperature and pressure conditions, the water vapor pulse is maintained for between about 0.2 seconds and 5.0 seconds. Preferably, stoichiometric or near-stoichiometric $SiO_2$ is produced.

After the oxygen source pulse is turned off, carrier gas is allowed to flow for about 0.5 seconds to 4.0 seconds, preferably at least about 1.0 second, to purge the oxidizing source gas and reaction byproducts from the chamber prior to the next reactant pulse. In other arrangements, it will be understood that the chamber can be evacuated to remove the reactant species and byproducts.

Table I below provides an exemplary process recipe for one cycle of silicon oxide deposition.

TABLE I

Exemplary $SiO_2$ Deposition Cycle

| Phase | Carrier Flow (slm) | Reactant | Temperature (° C.) | Pressure (Torr) | Time (sec) |
|---|---|---|---|---|---|
| silicon | 0.8 | 3-aminopropyltriethoxysilane | 300 | 10 | 1.5 |
| purge | 0.8 | — | 300 | 10 | 1.5 |
| oxidant | 0.8 | ozone | 300 | 10 | 3.0 |
| purge | 0.8 | — | 300 | 10 | 1.5 |

In accordance with the principles of ALD, a second pulse of the silicon source gas is then injected into the carrier gas flow. The pulse is stopped, and the silicon source gas is removed from the chamber, followed by a second oxygen source gas pulse, which is then, in turn, stopped and removed from the chamber. These pulses are then continually alternated until the silicon oxide layer attains the desired thickness. Alternatively, the cycle of Table I can be mixed with cycles depositing other materials, as discussed below with respect to the embodiment of FIG. 4 and exemplary Table II ($Al_2O_3$). For convenience, Table I is labeled a "$SiO_2$" deposition cycle, though when mixed with other cycles it may form other materials. Table I is also referred to herein as representing a "primary cycle." Use of the term "primary" is for labeling purposes only, and does not imply relative importance of the material formed thereby nor the sequence in which different ALD cycles are employed.

Figure 3:
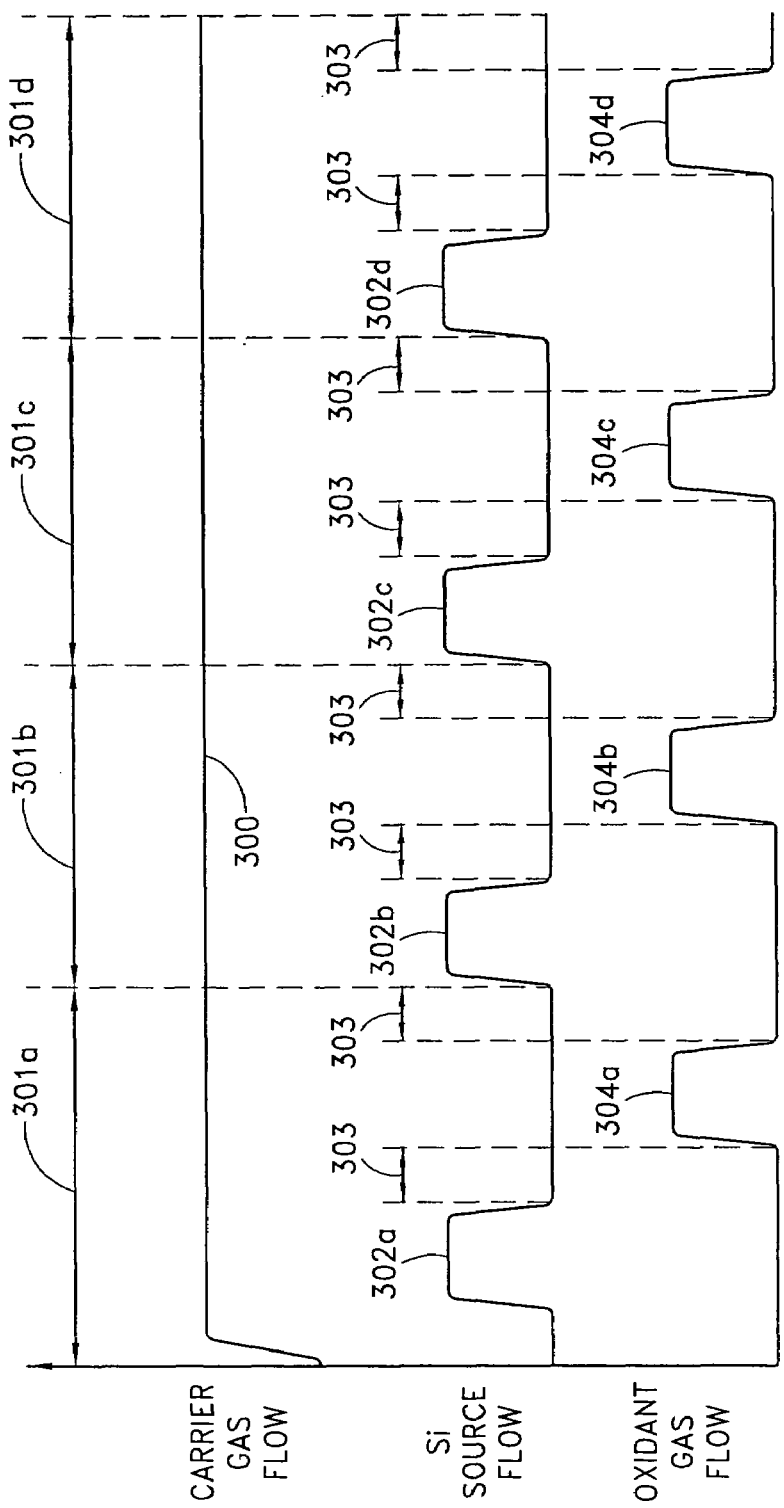
FIG. 3 is an exemplary atomic layer deposition gas flow diagram in accordance with a preferred embodiment, wherein silicon is deposited and then oxidized.

FIG. 3 is a gas flow diagram in accordance with the preferred embodiments, illustrating the first four cycles 301a-301d in an exemplary ALD process, wherein silicon dioxide is deposited. There is a continuous flow of a carrier gas 300 throughout the process. As shown, a first pulse or spike 302a of the silicon source gas is provided to form the first self-terminated silicon monolayer or less. After a first purge step 303, during which carrier gas continues to flow until the silicon source gas has been removed from the chamber, a first oxygen source gas pulse or spike 304a is provided. After a second purge 303, a second silicon source gas pulse 302b is provided, followed by a second oxygen source gas 304b, a third silicon source gas pulse 302c, a third oxygen source gas pulse 304c, etc., in alternating pulses separated by purge steps 303. Note that FIG. 3 is schematic only and is not drawn to scale.

Actually, in practice, the ALD process forms a full monolayer only after a plurality of cycles. Theoretically the reactants chemisorb at each available site on the exposed layer of the workpiece, but the physical size of the adsorbed species, particularly with the terminating ligands, generally limits coverage to a fraction of a monolayer with each cycle. In the illustrated embodiment, roughly 0.2 Å-0.3 Å of $SiO_2$ forms per cycle, whereas a true monolayer of $SiO_2$ is about 3 Å in height. A full monolayer forms after approximately ten cycles, where a cycle is represented by a pair of silicon source gas and oxidizing source gas pulses.

In another embodiment, a material mixture is deposited by ALD. Preferably, the mixture comprises two or more oxide species. The exemplary embodiment describes a mixture of silicon oxide (or silica) and aluminum oxide (or alumina). An exemplary process employs the primary cycle of Table I in conjunction with the secondary cycle of Table II below. In other arrangements, the skilled artisan will appreciate that other materials can be mixed together, or that other deposition processes can achieve the desired mix.

For the ALD aluminum oxide cycles, it is preferable to use temperature and pressure conditions that are close to or identical with the conditions used for the silicon oxide cycle because the pulse times are very short and it is not desirable to change these conditions between cycles.

Preferred precursor gases for aluminum deposition by ALD include aluminum halides (e.g., $AlCl_3$, $Al_2Cl_6$, $AlBr_3$, and $AlI_3$); alkyl aluminum compounds (e.g., triethyl aluminum or $(CH_3CH_2)_3Al$, trimethyl aluminum or TMA or $Al(CH_3)_3$ and others commercially available from Albemarle Corporation of USA); aluminum alkoxides (e.g., aluminum isopropoxide or $Al[OCH(CH_3)_2]_3$, aluminum ethoxide or $Al(OC_2H_5)_3$ and others available commercially from Strem Chemicals, Inc. of USA); aluminum beta-diketonates (e.g., $Al(acac)_3$, $Al(thd)_3$, $Al(hfac)_3$ and others commercially available from Strem Chemicals, Inc. of USA); and anhydrous aluminum nitrate. The synthesis of anhydrous aluminum nitrate has been described by G. N. Shirokova, S. Ya. Zhuk and V. Ya. Rosolovskii in *Russian Journal of Inorganic Chemistry*, vol. 21, 1976, pp. 799-802, the disclosure of which is incorporated herein by reference. The aluminum nitrate molecule breaks into aluminum oxide when it is contacted with organic compounds, such as ethers.

In the exemplary process, the aluminum source gas comprises trimethyl aluminum mixed with inert nitrogen gas, provided at a rate of between about 50 sccm and 400 sccm, more preferably between about 100 sccm and 200 sccm. The aluminum source gas flow is maintained for between about 0.2 second and 1.0 second under the preferred reactor conditions (as noted, preferably the same as those selected for silicon oxide deposition cycles), and more preferably for between about 0.3 second and 0.6 second. A monolayer of aluminum complex chemisorbs onto the substrate or the previously formed layer thereon. The surface termination of the monolayer inhibits further reaction with the aluminum source gas.

After the aluminum complex is deposited, and excess aluminum precursor gas and reaction byproducts are purged from the chamber, an oxidizing or oxidant pulse is provided. In the illustrated embodiment, the oxidizing source gas is most preferably water vapor. The water vapor is preferably injected into the carrier gas flow or inactive gas is bubbled through liquid water, forming moist oxidizing source gas. Under the preferred temperature and pressure conditions, the water vapor pulse is maintained for between about 0.2 second and 2.0 seconds, more preferably between about 0.5 second and 1.0 second. The purge gas pulse that follows lasts for between about 0.5 second and 3.0 seconds, more preferably between about 0.5 second and 1.0 second.

In other arrangements, if ozone is used as the oxidant, it is pulsed for between about 0.5 second and 5.0 seconds, more preferably between about 1.0 second and 3.0 seconds. The purge gas pulse that follows lasts for a duration of between about 0.3 second and 4.0 seconds, more preferably between about 0.5 second and 2.0 seconds. This ALD cycle is repeated until the desired aluminum oxide thickness is reached or, as for the preferred embodiment, ALD cycles for aluminum oxide and silicon oxide are run alternately.

Table II below provides an exemplary process recipe for one cycle of aluminum oxide deposition.

TABLE II $Al_2O_3$

| Phase | Carrier Flow (slm) | Reactant | Temperature (° C.) | Pressure (Torr) | Time (sec) |
|---|---|---|---|---|---|
| aluminum | 0.8 | trimethyl aluminum | 300 | 10 | 0.5 |
| purge | 0.8 | — | 300 | 10 | 0.8 |
| oxidant | 0.8 | water vapor | 300 | 10 | 0.8 |
| purge | 0.8 | — | 300 | 10 | 0.8 |

To achieve the desired material mixture in the illustrated embodiment, cycles of aluminum oxide deposition (such as Table II) are mixed with cycles of silicon oxide deposition (such as Table I) in an overall thin film ALD process. As noted with respect to silicon oxide, the term "aluminum oxide" or "$Al_2O_3$" cycle is used to refer to the steps of Table II, though when mixed with other cycles it may form other materials. Table II is also referred to herein as representing a "secondary cycle." Use of the term "secondary" is for labeling purposes only, and does not implying relative importance of the material formed thereby nor the sequence in which different ALD cycles are employed. The aluminum oxide cycles and silicon oxide cycles are continued in a ratio to achieve the concentrations desired until the target thickness for the mixed material layer is reached.

Figure 4:
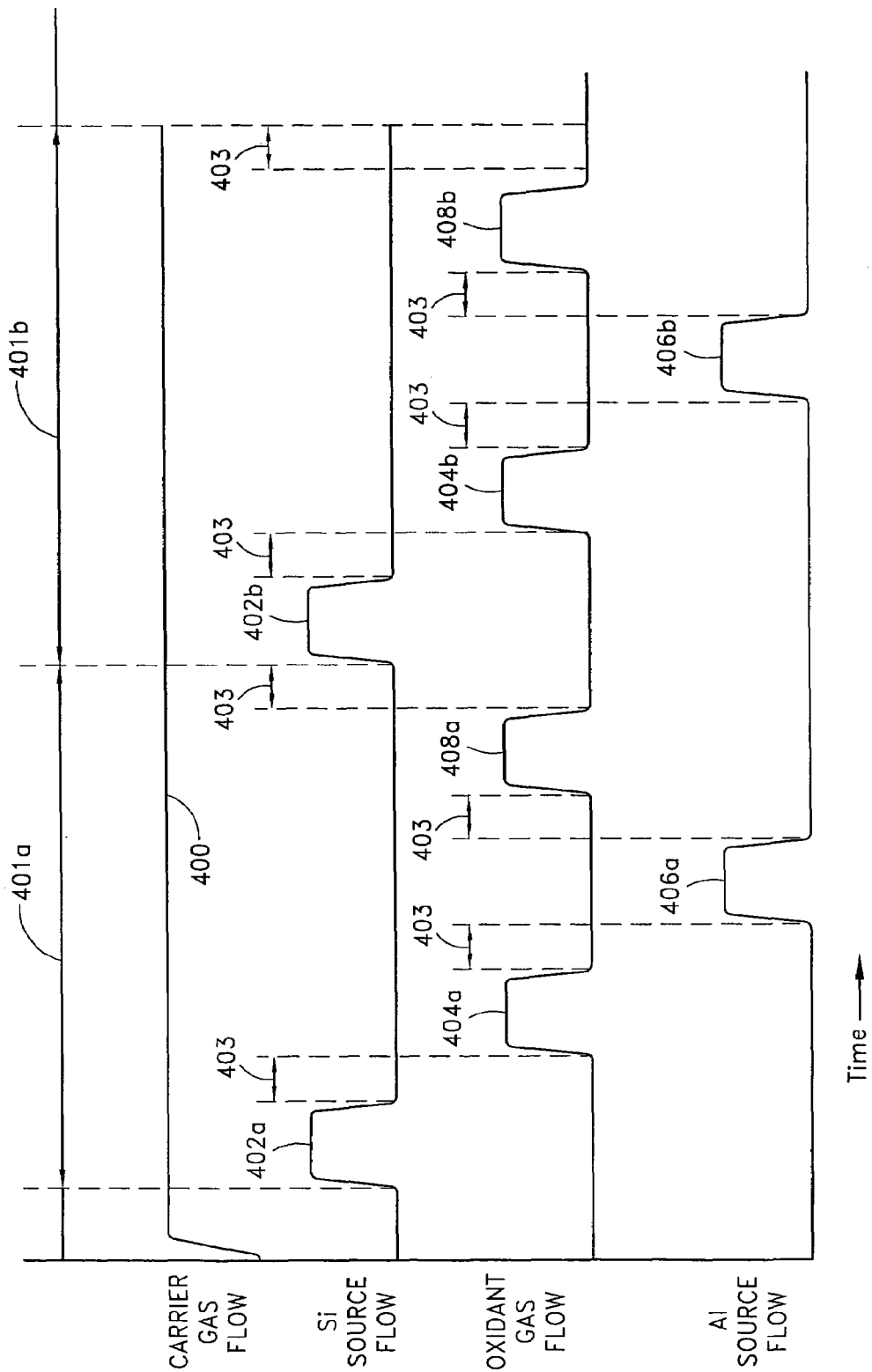
FIG. 4 is an exemplary atomic layer deposition gas flow diagram in accordance with a preferred embodiment, wherein silicon is deposited and oxidized and then aluminum is deposited and then oxidized.

FIG. 4 is a gas flow diagram that shows exemplary process steps of the illustrated embodiment, illustrating two different cycles 401a and 401b, each shown with silicon oxide ALD cycles and aluminum oxide ALD cycles. Each of the cycles 401a, 401b can be considered "mullite cycles" since consecutive silicon oxide and aluminum oxide cycles that make up the illustrated cycles 401a and 401b will generally be used in forming mullite phases. The skilled artisan will readily appreciate, however, that the ratio of silica cycles to alumina cycles to produce mullite ($3Al_2O_3*2SiO_2$) is not 1:1.

As has been described above, there is a continuous flow of a carrier gas 400 throughout the process. A first pulse or spike 402a of the silicon source gas is provided to form the first self-terminated silicon monolayer. After a first purge step 403, during which carrier gas continues to flow until the silicon source gas and reaction byproducts have been removed from the chamber, a first oxygen source gas pulse 404a is provided to convert the silicon layer to silicon dioxide. After a second purge 403, a pulse of aluminum source gas 406a is provided to form no more than a monolayer of aluminum in a self-terminated reaction, followed by a third purge 403. A second oxygen source gas 408a is provided to convert aluminum to alumina, followed by a fourth purge 403, thus ending the exemplary first complete cycle. The cycle can be repeated 401b in steps 402b through 408b with a purge 403 at the end. The ratio of the number of aluminum source cycles to the number of silicon source cycles can be adjusted, for example as M:N, where M and N are integers from 1 to 10 (between 10:1 and 1:10), to produce the desired concentration of these materials in the final product.

Preferred Trench Isolation Structure

Figure 5:
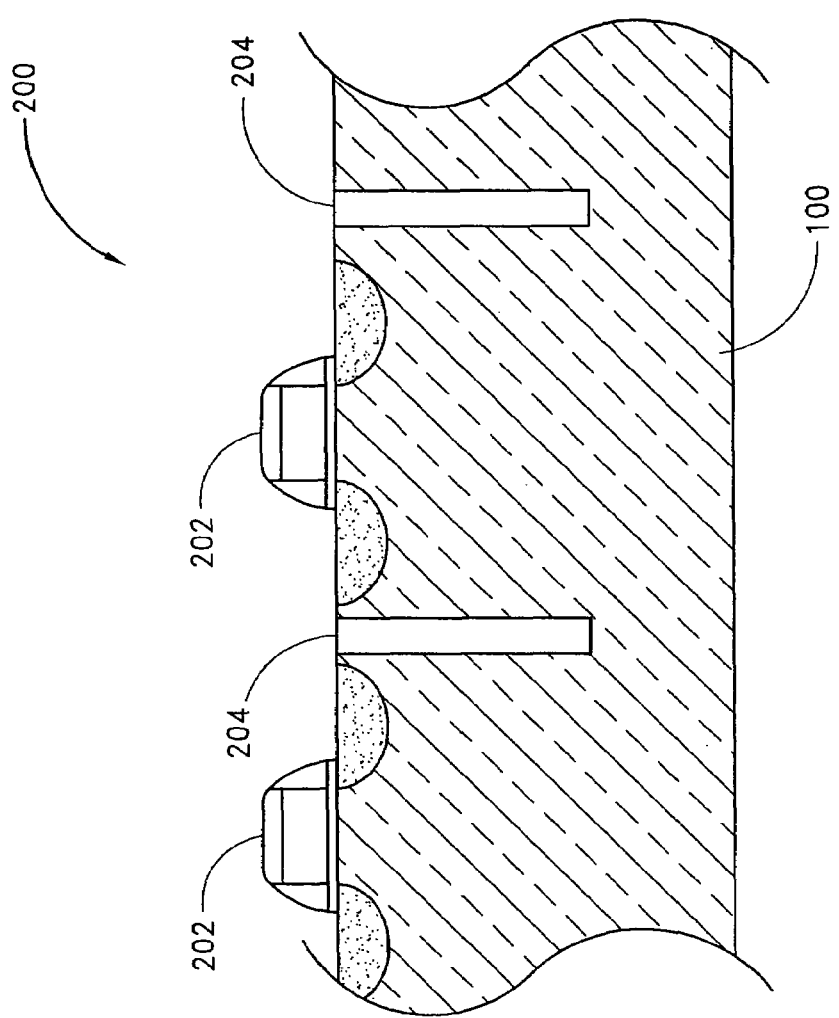
FIG. 5 is a schematic cross-section of a partially fabricated integrated circuit, illustrating isolation structures formed between active devices.

FIG. 5 is a schematic illustration of an exemplary integrated circuit 200 comprising an array of active devices 202, illustrated as integrated transistors. The active devices 202 are effectively isolated from each other by trench isolation structures 204. The trench isolation structures 204 form an effective barrier against parasitic currents and capacitances that might otherwise arise between active devices 202. In addition, the space between active devices 202 and, consequently, the width of the trench isolation structure 204 therein, should be minimized to increase the density of active devices 202 within an integrated circuit 200.

In the preferred embodiment, the width of the trench 204 is preferably less than about 100 nm, more preferably less than about 70 nm. The depth of the isolation trench can vary according to the isolation requirements of the specific integrated circuit. Accordingly, it can vary from as shallow as 0.2 μm to as deep as 1.0 μm. In the preferred embodiment, the aspect ratio of the trench, which is the ratio of the depth to the width, is preferably greater than 3:1, more preferably, greater than about 5:1.

Figure 6:
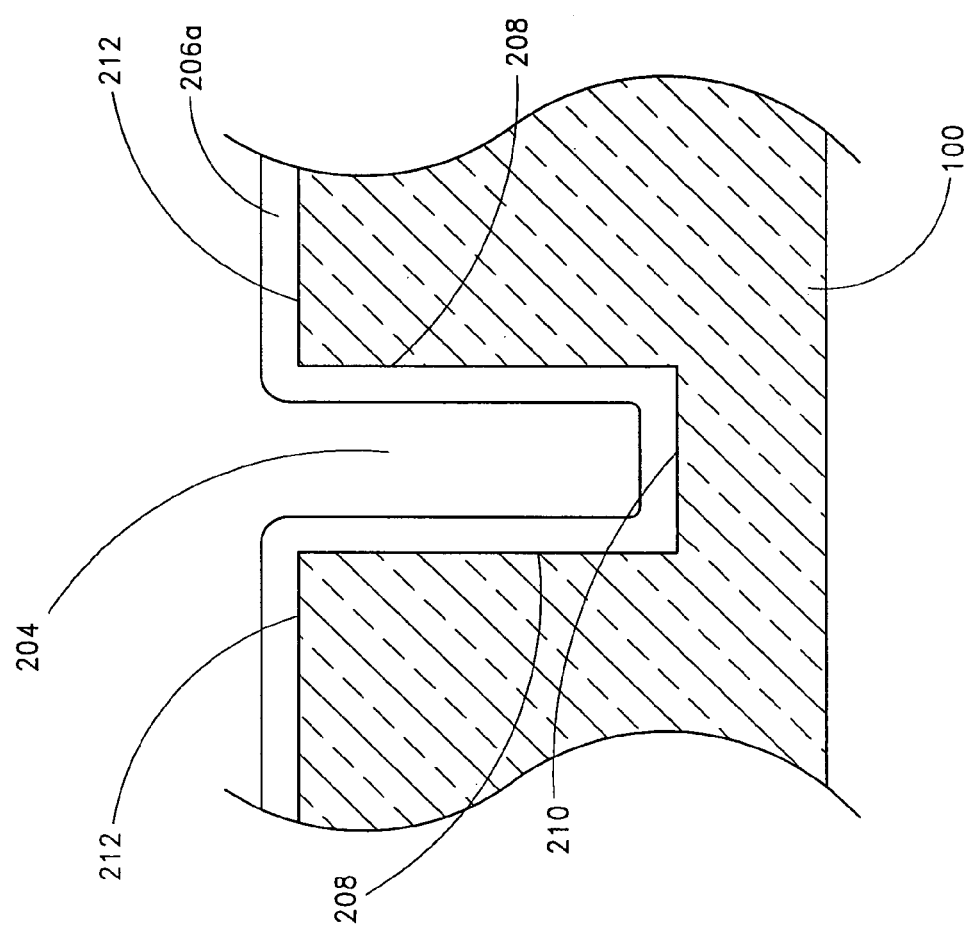
FIG. 6 is a schematic cross-section of a partially fabricated integrated circuit, illustrating a partially filled trench.

FIGS. 6 through 9 are cross-section drawings that illustrate the sequence for forming a trench isolation structure of the preferred embodiment. In FIG. 6, trench 204 is formed within a semiconductor substrate 100. Conventional photolithography techniques are employed to define the trench position and shield the rest of the wafer from the subsequent etch. Anisotropic etching, such as reactive ion etching, is preferred for producing a trench with vertical sidewalls.

FIG. 6 illustrates an insulating thin film 206a that has been built up by a series of monolayers through the ALD process as described above. The thin film 206a can comprise any suitable insulating material, including silicon dioxide. More preferably, however, the material is selected to have a coefficient of thermal expansion (CTE) that matches that of the surrounding substrate. Thin film 206a represents a plurality of ALD cycles, producing a film that is highly conformal to all surfaces of the trench 204, including the vertical sidewalls 208 and bottom 210, and also to the top surface 212 of the substrate 100.

Figure 7:
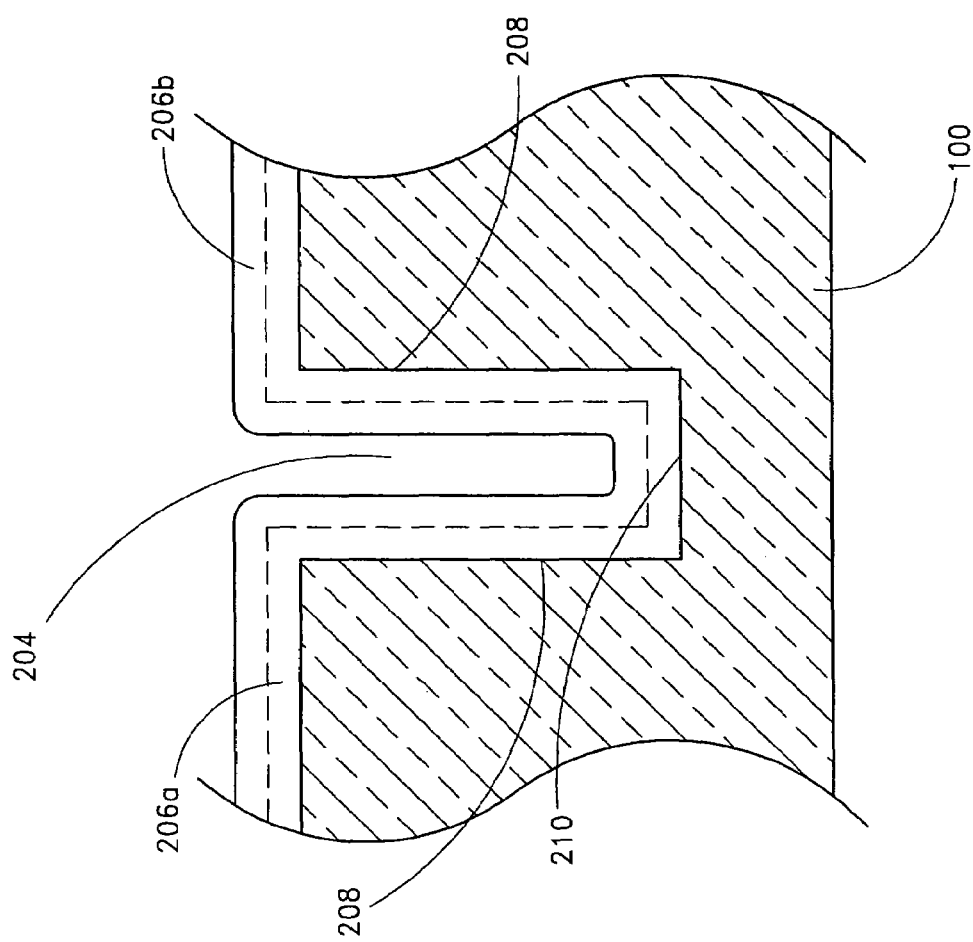
FIG. 7 is a schematic cross-section of a partially fabricated integrated circuit, illustrating the partially filled trench of FIG. 6 at a later stage of deposition.

FIG. 7 illustrates an isolation layer 206b at a subsequent deposition stage. The isolation layer 206b is a conformal continuation of the isolation layer 206a. It should be generally understood that the dashed line between layers 206a and 206b is arbitrary. Layer 206a indicates simply a "snapshot" of the deposition at some earlier time, $t_a$. It is not actually a discrete layer. Layer 206b indicates the deposition that has occurred between time $t_a$ and a later time $t_b$. The isolation layer 206b consists of a series of monolayers that build up on top of the isolation layer 206a.

Figure 8:
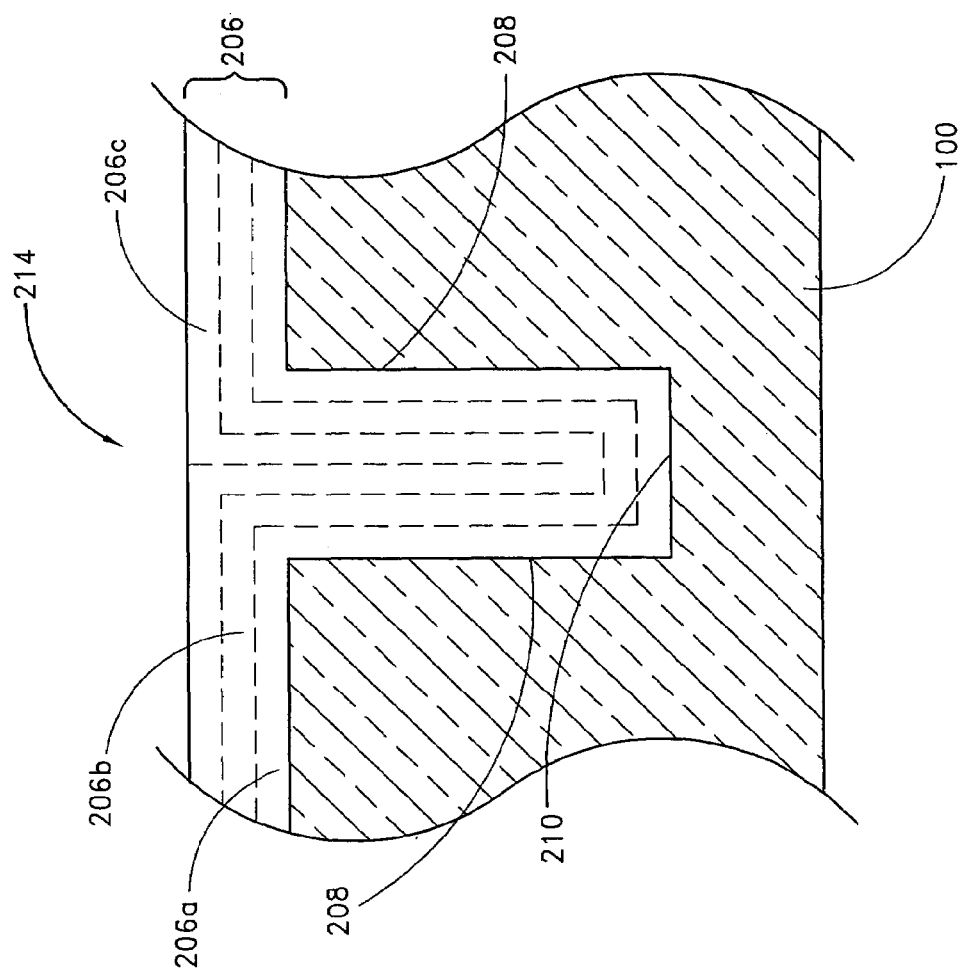
FIG. 8 is a schematic cross-section of a partially fabricated integrated circuit, illustrating a filled trench.

FIG. 8 illustrates an isolation layer 206 at a stage when the trench has been filled. The isolation layer 206c is a conformal continuation of the isolation layer 206b and is arbitrarily designated by a dashed line. At the final stage, the preferred layer 206c seals and fills the trench 204 completely, advantageously forming minimal or no discernible seam where the layers from opposing sides of the trench unite at the center. This is an advantage over chemical vapor deposition processing wherein a seam can form at the center of the trench and can even contain voids, particularly when subjected to thermal cycling.

Figure 9:
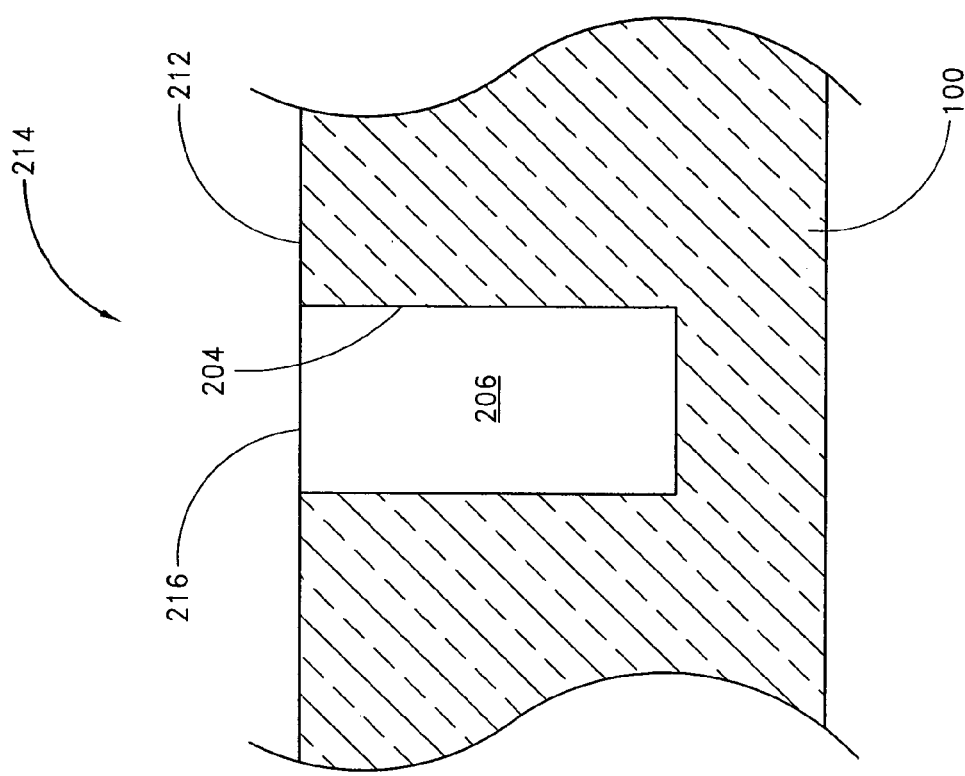
FIG. 9 is a schematic cross-section of a partially fabricated integrated circuit, illustrating the filled trench of FIG. 8 after planarization.

As shown in FIG. 9, trench isolation structure 214 is preferably planarized, such as by chemical mechanical polishing (CMP) or a reactive ion etchback process that does not disturb the isolation layer 206 inside the trench 204. FIG. 9 illustrates the trench isolation structure 214 after the isolation material has been removed from the top surface 212 of the substrate 100 by planarization. The trench isolation structure 214 has a planar surface 216 at its top opening that is level with the top surface 212 of the substrate. This planarity is advantageous for subsequent conformality of deposited layers and photolithographic processes.

In another embodiment, a trench isolation structure is filled with ALD material as described above, except that two different materials are deposited, for example, as outlined in the gas flow diagram of FIG. 4. These materials may not be in equilibrium at the processing temperatures of the semiconductor wafer, in which case, they undergo a phase transformation to an equilibrium two-phase mixture. In yet another embodiment, more than two different materials are deposited. Deposited materials can be chosen to effect multi-phase mixtures with desirable properties, such as coefficient of thermal expansion (CTE) or dielectric constant.

In an exemplary embodiment, the trench is filled with an insulating material selected to match the CTE of the surrounding substrate. In the illustrated example, the isolation material comprises a mixture of silica (nominally $SiO_2$) and alumina (nominally $Al_2O_3$). These two materials do not exist in equilibrium, especially at the temperatures to which the wafer is exposed during integrated circuit fabrication. Also, with the two materials deposited by selected ratios of alumina to silica cycles in a continuous ALD process, as described above, there is no significant diffusion kinetics barrier to overcome in reaching equilibrium, so a transformation to the equilibrium structure can occur. Optionally, after deposition, an annealing step can be used to densify and remove water from the insulating mixture.

Figure 10:
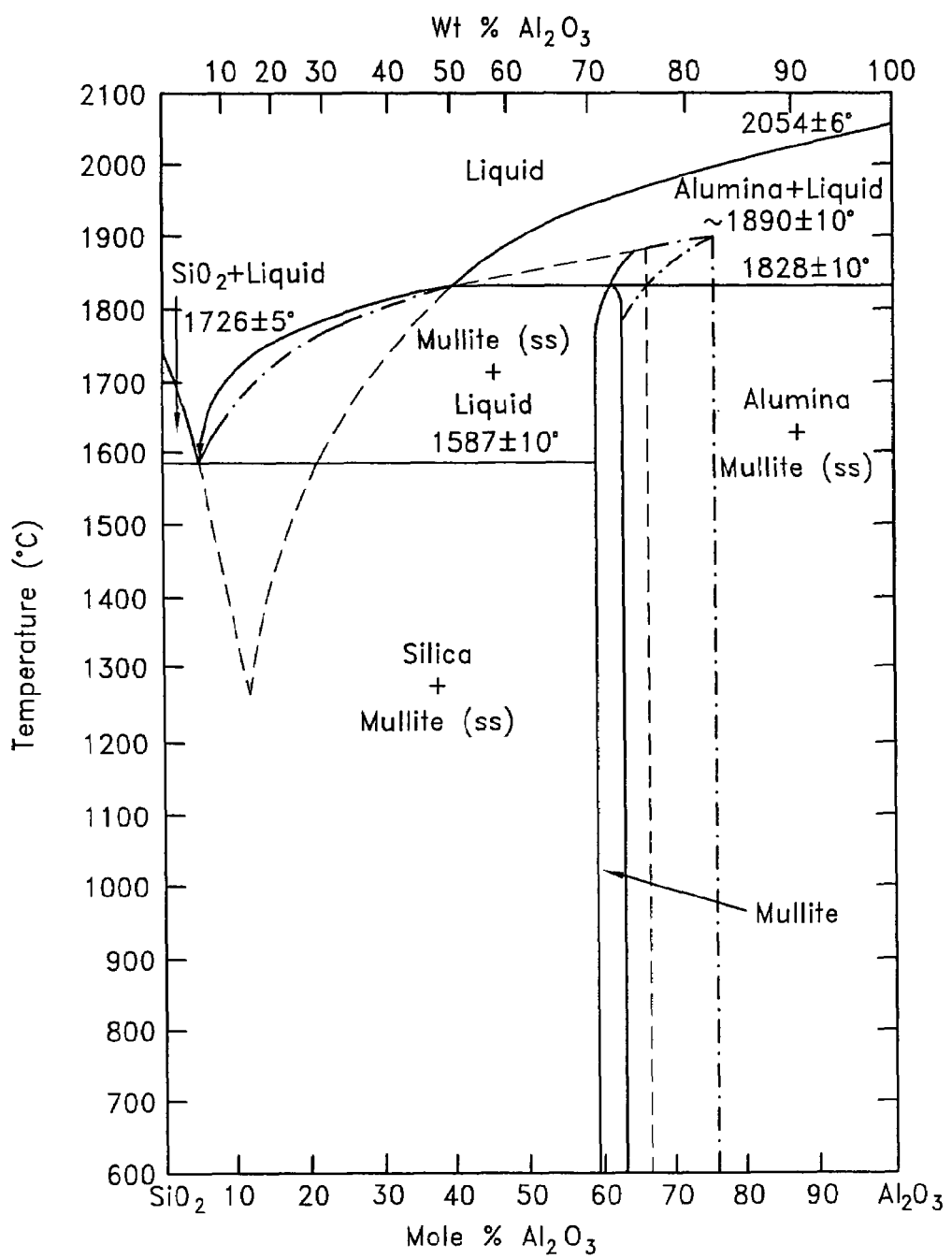
FIG. 10 is an equilibrium phase diagram for silicon oxide (silica) and aluminum oxide (alumina).

FIG. 10 shows the silica-mullite phase diagram from W. E. Lee and W. M. Rainforth, Ceramic Microstructures, Chapam and Hall, p. 297 (1994). At temperatures less than about 1600° C., the equilibrium result of a mixture containing less than about 70 weight percent alumina with silica is a two-phase mixture of silica ($SiO_2$) and mullite ($3Al_2O_3*2SiO_2$). Silica and mullite are continuously miscible in this composition range. To a first approximation, their coefficient of thermal expansion (CTE) scales linearly. If a dielectric mixture with a CTE close to the CTE of silicon is used to fill the silicon trench, it is able to withstand large changes in temperature without stress at the dielectric/silicon interface.

Figure 11:
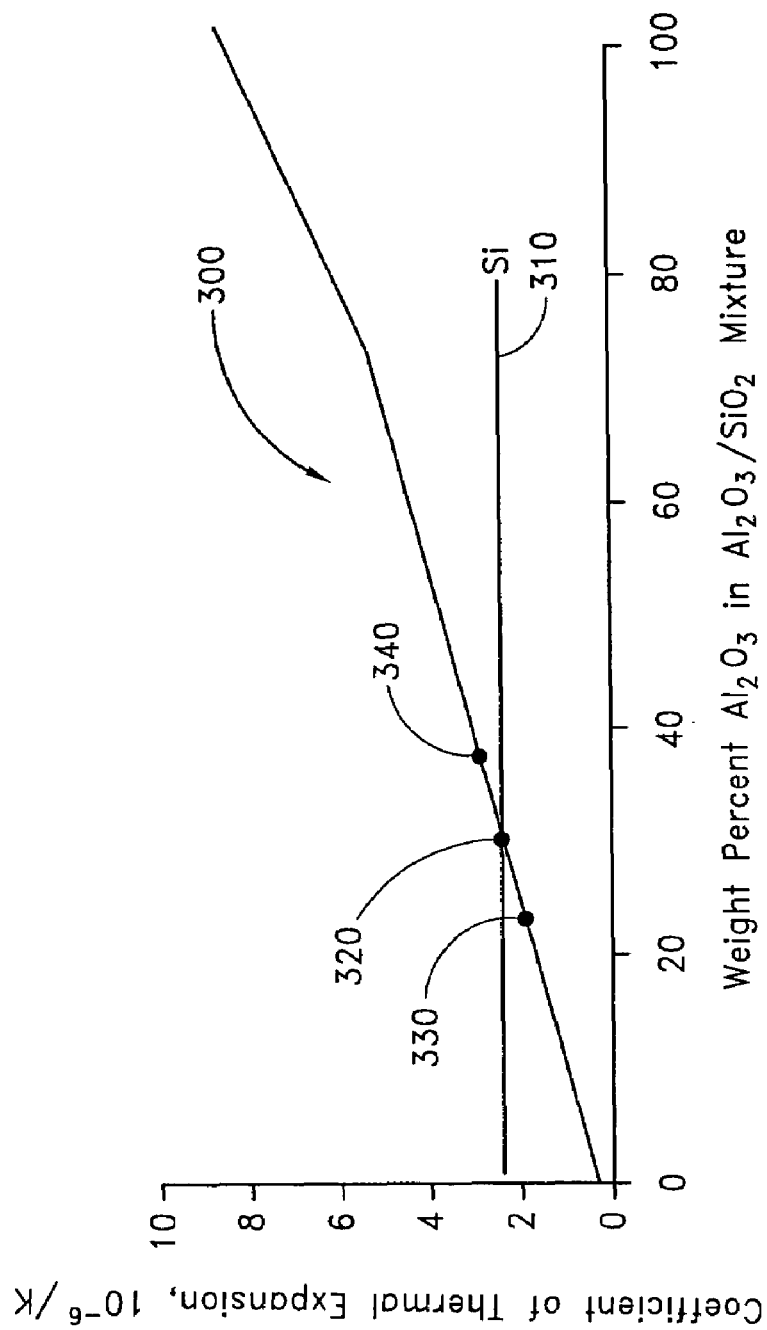
FIG. 11 is a plot of coefficient of thermal expansion as a function of weight percent $Al_2O_3$ in an $Al_2O_3/SiO_2$ mixture.

Line 300 in FIG. 11 shows the coefficient of thermal expansion as a function of weight percent of $Al_2O_3$ in a mixture with $SiO_2$. The CTE of silicon is shown by the horizontal line 310 at $2.3 \times 10^{-6}$/K. The slope of mixture line 300 is not very steep near its intersection 320 with silicon line 310. At the intersection 320, a composition of about 30 wt % (weight percent) $Al_2O_3$ and about 70 wt % $SiO_2$, which is a two-phase mixture of about 40 wt % mullite and about 60 wt % silica at equilibrium, has the same coefficient of thermal expansion (CTE) as silicon, i.e., $2.5 \times 10^{-6}$/K.

Preferably, the mixture composition is such that the CTE falls within about plus or minus 20% of the CTE of silicon, i.e., in the range from about $2.0 \times 10^{-6}$/K at point 330 to about $3.0 \times 10^{-6}$/K at point 340. This corresponds to an $Al_2O_3$ concentration between about 23 wt % and about 37 wt % in the mixture, and, after a phase transformation to thermal equilibrium, the two-phase mixture ranges from about 25 wt % mullite/75 wt % silica to about 50 wt % mullite/50 wt % silica. More preferably, the mixture's CTE falls within about plus or minus 10% of the CTE of the surrounding material, or between about $2.25 \times 10^{-6}$/K and $2.75 \times 10^{-6}$/K. This corresponds to an $Al_2O_3$ concentration in the mixture between about 26 wt % and about 34 wt %, and, after a phase transformation to thermal equilibrium, the two-phase mixture ranges from about 35 wt % mullite/65 wt % silica to about 40 wt % mullite/60 wt % silica.

Preferably, to achieve a CTE within about 20% of silicon's CTE, ALD can be conducted with a ratio of silica cycles to alumina cycles of between about 20:1 and 1:10. More preferably, a CTE within about 10% of silicon's CTE can be achieved with a ratio of silica ("primary") cycles to alumina ("secondary") cycles of between about 10:1 and 3:1

Accordingly, there are several advantages in the described invention. For example, ALD material conformally fills a narrow opening, particularly a trench isolation structure, which advantageously allows for increased the packing density of active devices in an integrated circuit. Additionally, due to ALD conformality, trench sidewalls can be formed vertically to increase the packing density of integrated circuit devices. Furthermore, ALD technology permits precise control over thin layer dimensions, thus allowing for custom tailoring of trench isolation devices with very narrow and deep openings, as needed for device isolation requirements.

By understanding the phase transformations that occur with each combination of materials deposited, a wider variety of material properties can be engineered than from the as-deposited materials alone. Concentration ratios can be carefully chosen to effect transformation to specific two-phase mixtures that have desirable properties, such as linear coefficient of thermal expansion or dielectric constant, for trench isolation structures.

The skilled artisan will readily appreciate, in view of the disclosure herein, that other methods can be employed to achieve the desired CTE matching of filler material with surrounding trench. ALD, however, advantageously provides excellent process control to produce near-perfect step coverage (preferably greater than 95%, more preferably greater than 98%) over high aspect ratio trenches. Furthermore, the ALD process can also be readily tuned by adjusting ratios of reactant pulses or cycles, as described herein, to attain the desired composition.

Furthermore, though described with particular materials and in the context of shallow trench isolation, the skilled artisan will readily find application for the principles and advantages described herein for matching CTE of other materials and structures in the course of integrated circuit fabrication. Another example is the filling of a contact via with conductive material having a CTE matched to that of surrounding insulating material. As newer materials are developed for advanced fabrication of ever-faster circuits, the flexibility of the processes described herein can be readily adapted to address CTE matching for various materials in integrated circuits.

Thus, although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

We claim:

1. An integrated circuit, comprising:
   a semiconductor substrate with a plurality of neighboring active device regions;
   openings embedded within the semiconductor substrate between the neighboring active device regions; and
   an insulating material that fills the openings, the insulating material comprising a mixture of silica ($SiO_2$) and aluminum oxide ($Al_2O_3$), having between about 23% and 37% aluminum oxide.

2. The integrated circuit of claim 1, wherein the insulating material has between about 26% to 34% of aluminum oxide.

3. The integrated circuit of claim 1, wherein the insulating material has a coefficient of thermal expansion between about $2.0 \times 10^{-6}$/K and $3.0 \times 10^{-6}$/K.

4. The integrated circuit of claim 3, wherein the insulating material has a coefficient of thermal expansion between about $2.25 \times 10^{-6}$/K and $2.75 \times 10^{-6}$/K.

5. The integrated circuit of claim 1, wherein the openings have an aspect ratio greater than about 3:1.

6. The integrated circuit of claim 5, wherein the openings have an aspect ratio greater than about 5:1.

7. The integrated circuit of claim 1, wherein the openings are narrower than about 100 nm.

8. A trench isolation structure in an integrated circuit, comprising:
   an opening embedded within a semiconductor substrate between neighboring devices; and
   an insulating material that fills the opening and that has a linear coefficient of thermal expansion within about 20% of a linear coefficient of thermal expansion of the semiconductor substrate, wherein the insulating material is a mixture of silica and alumina having between about 23% and 37% aluminum oxide.

9. The trench isolation structure of claim 8, wherein the insulating material has between about 26% and 34% alumina by weight.

10. A trench isolation structure in an integrated circuit, comprising:
    an opening embedded within a semiconductor substrate between neighboring devices, wherein the opening is narrower than about 100 nm; and
    an oxide insulating material that fills the opening and that has a linear coefficient of thermal expansion within about 20% of a linear coefficient of thermal expansion of the semiconductor substrate wherein the insulating material comprises a mixture of silica ($SiO_2$) and aluminum oxide ($Al_2O_3$), having between about 23% and 37% aluminum oxide.

11. The integrated circuit of claim 10, wherein the insulating material has between about 26% to 34% of aluminum oxide.

12. The trench isolation structure of claim 10, wherein the insulating material comprises a mixture of at least two oxide phases selected to have a coefficient of thermal expansion that matches the semiconductor substrate.

13. The trench isolation structure of claim 10, wherein the insulating material that fills the opening contains no voids.

14. The trench isolation structure of claim 10, wherein the opening is narrower than about 70 nm.

* * * * *